(12) United States Patent
Hwang et al.

(10) Patent No.: US 9,121,555 B2
(45) Date of Patent: Sep. 1, 2015

(54) LENS AND LIGHT EMITTING MODULE FOR SURFACE ILLUMINATION

(71) Applicant: Seoul Semiconductor Co., Ltd., Ansan-si (KR)

(72) Inventors: Sung Ki Hwang, Ansan-si (KR); Eun Ju Kim, Ansan-si (KR); Jung Doo Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/245,066

(22) Filed: Apr. 4, 2014

(65) Prior Publication Data

US 2014/0301085 A1    Oct. 9, 2014

(30) Foreign Application Priority Data

Apr. 4, 2013    (KR) ........................ 10-2013-0036843

(51) Int. Cl.
*F21K 99/00* (2010.01)
*F21V 5/04* (2006.01)
(Continued)

(52) U.S. Cl.
CPC ... *F21K 9/50* (2013.01); *F21V 5/04* (2013.01); *F21V 7/05* (2013.01); *F21V 13/04* (2013.01); *G02B 3/08* (2013.01); *G02B 19/0028* (2013.01); *G02B 19/0061* (2013.01); *H01L 33/58* (2013.01); *F21K 9/00* (2013.01); *F21Y 2101/02* (2013.01)

(58) Field of Classification Search
CPC .......... F21K 9/50; F21V 5/048; F21V 13/04; G02B 3/08; G02B 19/0061; B02B 19/0028
USPC ........... 362/84, 237, 249.02, 311.01, 311.02, 362/311.06, 311.09, 311.1, 311.14, 327, 362/329, 334, 335, 646
See application file for complete search history.

(56) References Cited

U.S. PATENT DOCUMENTS 8,016,451 B2 *    9/2011    Householder et al. ... 362/311.02
2009/0207586 A1    8/2009    Arai et al.
(Continued)

FOREIGN PATENT DOCUMENTS

| JP | 2007-208301 | 8/2007 |
|---|---|---|
| JP | 2011--096712 | 5/2011 |
| KR | 10-2011-0055867 | 5/2011 |

OTHER PUBLICATIONS

International Search Report issued on Feb. 17, 2014, in International Application No. PCT/KR2013/009689.
(Continued)

*Primary Examiner* — Y M Lee
(74) *Attorney, Agent, or Firm* — H.C. Park & Associates, PLC

(57) ABSTRACT

Disclosed herein is a lens and light emitting module for surface illumination. The light emitting module includes a circuit board; a light emitting device mounted on the circuit board; and a lens dispersing light emitted from the light emitting device. The lens includes a lower surface formed with a concave section defining a light incident surface through which light enters the lens, an upper surface through which light exits the lens, and legs coupled to the circuit board and disposed farther outside the lens than an area of the upper surface. The light emitting device is disposed within the concave section of the lens. With this structure, the lens and the light emitting module can be reduced in thickness.

15 Claims, 13 Drawing Sheets

(51) Int. Cl.
*F21V 7/05* (2006.01)
*F21V 13/04* (2006.01)
*G02B 3/08* (2006.01)
*G02B 19/00* (2006.01)
*H01L 33/58* (2010.01)
*F21Y 101/02* (2006.01)

(56) References Cited

U.S. PATENT DOCUMENTS

| | | |
|---|---|---|
| 2011/0096553 A1 | 4/2011 | Shimokawa |
| 2011/0116272 A1 | 5/2011 | Bak et al. |
| 2011/0128745 A1 | 6/2011 | Chen et al. |
| 2012/0081618 A1* | 4/2012 | Matsui ...................... 362/311.01 |
| 2012/0120343 A1* | 5/2012 | Yamamoto ................ 362/311.01 |
| 2012/0153328 A1* | 6/2012 | Tsutsui .......................... 257/98 |
| 2013/0094218 A1 | 4/2013 | Wang et al. |
| 2013/0229808 A1* | 9/2013 | Wang et al. .............. 362/311.01 |

OTHER PUBLICATIONS

Written Opinion issued on Feb. 17, 2014, in International Application No. PCT/KR2013/009689.

Non-Final Office Action issued on Jan. 22, 2015, in U.S. Appl. No. 14/065,807.

* cited by examiner (a)  (b)  (c)  (d)

(a)

(b)

(a)

(b)

(a)

(b)

(a)

(b)

(a)

(b)

(a)

(b)

(a)

(b)

(c)

(a)

(b)

LENS AND LIGHT EMITTING MODULE FOR SURFACE ILLUMINATION

CROSS-REFERENCE TO RELATED APPLICATION

This application claims priority from and the benefit of Korean Patent Application No. 10-2013-0036843, filed on Apr. 4, 2013, which is hereby incorporated by reference for all purposes as if fully set forth herein.

BACKGROUND

1. Field

The present invention relates to a light emitting module, and more particularly, to a lens for surface illumination and a light emitting module for surface illumination including the same.

2. Discussion of the Background

A light emitting module for back lighting a liquid crystal display or a light emitting module for surface illumination used in a luminaire for surface illumination generally includes light emitting devices mounted on a circuit board, and a lens which disperses light emitted from light emitting devices at a wide angle. The light emitted from the light emitting device is uniformly dispersed through the lens, thereby allowing uniform illumination of a wide area using a small number of light emitting devices.

FIG. 1a and FIG. 1b are a schematic sectional view and a schematic perspective view of a typical light emitting module and a typical lens in the art, respectively.

Referring to FIG. 1a and FIG. 1b, the light emitting module includes a circuit board 100, a light emitting device 200, and a lens 300. The circuit board 100 is a printed circuit board on which a circuit is formed to supply power to the light emitting device 200.

The light emitting device 200 generally includes a light emitting diode chip 210, a molding member 230 covering the light emitting diode chip 210, and a package substrate 250. The molding member 230 includes phosphors for wavelength conversion of light emitted from the light emitting diode chip 210, and may have a lens shape. The package substrate 250 may have a recess on which the light emitting diode chip 210 is disposed. The light emitting device 200 is electrically connected to the circuit board 100.

The lens 300 includes a lower surface 310 and an upper surface 350, and may include a flange 370 and legs 390. With the legs 310 of the lens attached to an upper side of the circuit board 100, the lens 300 is disposed above the light emitting device 200. As shown in FIG. 1b, the lens generally includes three legs 310 disposed at apexes of an equilateral triangular shape.

The lens 300 has a light incident surface 330 through which light emitted from the light emitting device 200 enters the lens 300, and a light exit surface 350 through which the incident light exits. The light incident surface 330 is an inner surface of an artillery shell-shaped concave section 320 formed on the lower surface 310 of the lens 300. Since the concave section 320 is disposed above the light emitting device 200, the light emitted from the light emitting device 200 enters the lens 300 through the light incident surface 330. The light exit surface 350 allows the light entering the lens 300 to exit the lens at a wide beam angle therethrough.

A typical light emitting module can realize uniform light over a wide area by allowing light emitted from the light emitting device 200 to be dispersed through the lens 300. However, since the light emitting device 200 mounted on the circuit board 100 employs the package substrate 250, the light emitting device 200 has a relatively large size. As a result, the concave section 320 for forming the light incident surface 330 of the lens 300 has a relatively large entrance and a relatively great height, thereby making it difficult to obtain a slim structure of the lens 300. Moreover, since the light emitted from the light emitting device 200 has a relatively narrow beam angle, there is a limit in dispersion of the light through the lens 300.

Moreover, since the light emitting device 200 is disposed below the lower surface 310 of the lens 300, some of light emitted from the light emitting device 200 does not enter the lens 300 and can be lost below the lower surface of the lens 300.

SUMMARY OF THE INVENTION

Exemplary embodiments of the present invention provide a technique capable of reducing a thickness of a lens and a light emitting module for surface illumination.

Exemplary embodiments of the present invention provide a lens and a light emitting module capable of reducing loss of light emitted from a light emitting device.

Exemplary embodiments of the present invention provide a light emitting module which adopts a light emitting device suitable for surface illumination to provide uniform light over a wide area.

Exemplary embodiments of the present invention provide a lens which can be easily applied to a bar-shaped circuit board having a narrow width.

Additional features of the present invention will be described in the following descriptions and become apparent from the following description or can be understood through practice of the present invention.

An exemplary embodiment of the present invention provides a light emitting module, which includes a circuit board; a light emitting device mounted on the circuit board; and a lens coupled to the circuit board and dispersing light emitted from the light emitting device. The lens includes a concave section defining a light incident surface through which light enters the lens, an upper surface through which light exits the lens, and legs coupled to the circuit board and disposed farther outside the lens than an area of the upper surface. The light emitting device is disposed within the concave section of the lens. Since the light emitting device is disposed within the concave section of the lens, the light emitting module allows most of light emitted from the light emitting device to enter the lens, thereby reducing light loss below a lower surface of the lens. Further, since the legs are disposed outside the lens, the legs may have a relatively long length. Accordingly, when the legs are mounted on the circuit board using adhesives, it is possible to prevent deterioration in capabilities of the lens due to sticking of the adhesives to the lower surface of the lens.

The light emitting device includes a light emitting diode chip; and a wavelength conversion layer coated onto the light emitting diode chip. The light emitting device is a chip level light emitting device and may be different than a typical light emitting diode package including a package body. In other words, the light emitting device does not include a mounting member for mounting a light emitting diode chip, and may employ the circuit board as the mounting member of the light emitting diode chip.

The wavelength conversion layer may cover an upper surface and a side surface of the light emitting diode chip. Particularly, the light emitting diode chip may be a flip-chip type light emitting diode chip which is coupled to the circuit board by flip-chip bonding. As the flip-chip type light emitting diode chip is directly mounted on the circuit board, the size of the light emitting device can be reduced, as compared with a typical light emitting device employing a package substrate, thereby achieving slimness of the light emitting module. In addition, since the light emitting device has a small size, the size of the concave section of the lens and the total height of the lens can be reduced.

The concave section of the lens may have a greater entrance width than the width of the light emitting device. Furthermore, the entrance width of the concave section of the lens may be twice or less the width of the light emitting device. When the entrance width of the concave section of the lens is set to be twice or less the width of the light emitting device, it is possible to reduce alignment error between the lens and the light emitting device. Particularly, the concave section of the lens may have an entrance width of 3 mm or less, or 2 mm or less.

The lens includes a lower surface having the concave section; and an upper surface through which light entering the lens through the light incident surface of the concave section exits the lens. The light incident surface of the lens corresponds to an inner surface of the concave section and is defined by a shape of the concave section. The light incident surface of the lens may include an upper end surface and a side surface extending from the upper end surface to the entrance of the concave section. The concave section may have a shape, a width of which gradually decreases from the entrance of the concave section to the upper end surface thereof. The side surface of the concave section may be a slanted surface having a predetermined slope from the entrance of the concave section to the upper end surface thereof or may be a roundly slanted surface having a slope decreasing from the entrance of the concave section to the upper end surface thereof. The upper end surface may be a flat surface, but is not limited thereto. Alternatively, the upper end surface may include a concave surface or a convex surface, and may include a light scattering pattern.

The upper surface of the lens has a shape of dispersing light entering lens so as to have a wide beam distribution. The upper surface of the lens may include a concave surface disposed near a central axis of the lens and a convex surface extending from the concave surface. Alternatively, the upper surface of the lens may include a flat surface disposed near the central axis of the lens and a convex surface extending from the flat surface. Since the upper end surface has a planar shape or includes a light scattering pattern instead of a concave surface in the related art, it is possible to reduce influence on distribution of light beams even upon misalignment of the central axes of the light emitting device and the lens, thereby increasing alignment tolerance of the light emitting device and the lens.

On the other hand, the lower surface of the lens includes a flat surface surrounding the concave section and a slanted surface surrounding the flat surface. The flat surface is brought into close contact with the circuit board. When a reflective sheet is disposed on the circuit board, the flat surface may be brought into close contact with the reflective sheet. On the other hand, the slanted surface is slanted upwards from the flat surface and has a slope of less than about 10° relative to the flat surface. With this structure, the light emitting module can reduce light loss using the slanted surface through total reflection inside the lens while allowing light emitted from the light emitting device to be dispersed in a wide beam distribution.

The lens may include a flange; and a pair of leg supports connecting the legs to the flange. The pair of leg supports may be disposed on an upper area of the circuit board. Thus, when the circuit board has a narrow width, the pair of leg supports is disposed at opposite sides of the lens in one direction.

Each of the leg supports may be connected to a plurality of legs. In addition, a distance between the legs in one leg support is less than the distance between the leg supports. Accordingly, the lens can be stably coupled to the circuit board having a narrow width. The legs may be coupled to the circuit board by adhesives.

In certain embodiments of the invention, the light emitting diode chip may include: a first conductive-type semiconductor layer; a plurality of mesas separated from each other on the first conductive-type semiconductor layer, and each including an active layer and a second conductive-type semiconductor layer; reflective electrodes disposed on the plurality of mesas and forming ohmic contact with the second conductive-type semiconductor layers, respectively; and a current spreading layer covering the plurality of mesas and the first conductive-type semiconductor layer, and having openings disposed within upper areas of the corresponding mesas and exposing the reflective electrodes, respectively, the current spreading layer forming ohmic contact with the first conductive-type semiconductor layer and insulated from the plurality of mesas. Here, the light emitting diode chip is coupled to the circuit board by flip-chip bonding.

Since the current spreading layer covers the plurality of mesas and the first conductive-type semiconductor layer, the light emitting module has improved current dispersing capabilities through the current dispersion layer.

The first conductive-type semiconductor layer has a continuous shape. In addition, the plurality of mesas may have elongated shapes extending parallel to each other in one direction, and the openings of the current spreading layer may be biased towards the same ends of the plurality of mesas. Accordingly, a pad connecting the reflective electrodes exposed through the openings of the current spreading layer can be easily formed.

The current spreading layer may include a reflective metal such as Al. Thus, in addition to reflection of light by the reflective electrodes, the light emitting module can obtain reflection of light by the current dispersion layer, whereby light traveling through side surfaces of the plurality of mesas and the first conductive-type semiconductor layer can be reflected.

On the other hand, each of the reflective electrodes may include a reflective metal layer and a barrier metal layer. The barrier metal layer may cover an upper surface and a side surface of the reflective metal layer. With this structure, the barrier metal layer prevents the reflective metal layer from being exposed outside, thereby preventing deterioration of the reflective metal layer.

The light emitting diode chip may further include an upper insulation layer covering at least part of the current spreading layer and having openings exposing the reflective electrodes; and a second pad disposed on the upper insulation layer and connected to the reflective electrodes exposed through the openings of the upper insulation layer, and may further include a first pad connected to the current dispersion layer. The first pad and the second pad may be formed in the same shape and the same size, thereby allowing easy flip-chip bonding.

The light emitting diode chip may further include a lower insulation layer disposed between the plurality of mesas and the current spreading layer and insulating the current spreading layer from the plurality of mesas. The lower insulation layer may have openings disposed within upper areas of the mesas and exposing the reflective electrodes, respectively.

Furthermore, each of the openings of the current spreading layer may have a greater width than the openings of the lower insulation layer to expose all of the openings of the lower insulation layer. That is, the openings of the current spreading layer have sidewalls disposed on the lower insulation layer. In addition, the light emitting diode chip may further include an upper insulation layer covering at least part of the current spreading layer and having openings through which the reflective electrodes are exposed. The upper insulation layer may cover sidewalls of the openings of the current dispersion layer.

The lower insulation layer may be a reflective dielectric layer, for example, a distributed Bragg reflector (DBR).

The light emitting diode chip may further include a growth substrate, and the growth substrate may be, for example, a sapphire substrate or a gallium nitride substrate. The wavelength conversion layer covers the growth substrate and converts wavelengths of light discharged through the growth substrate.

DETAILED DESCRIPTION OF THE ILLUSTRATED EMBODIMENTS

Figure 1A:
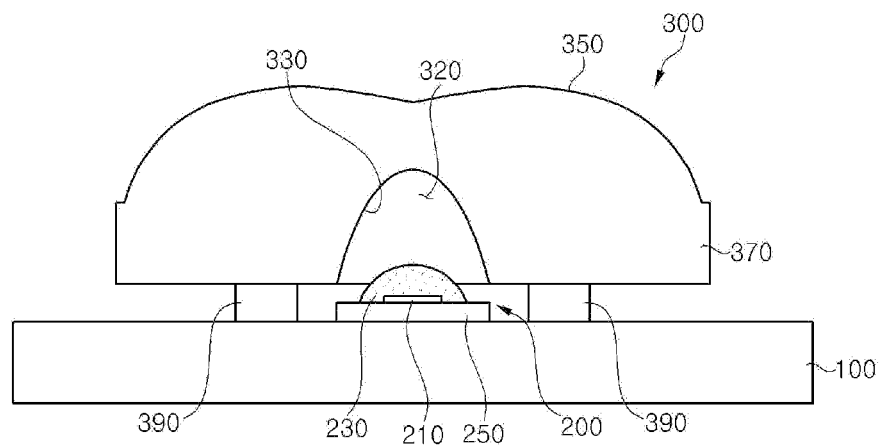
FIG. 1a is a sectional view of a typical light emitting module in the art.

Now, embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Figure 2A:
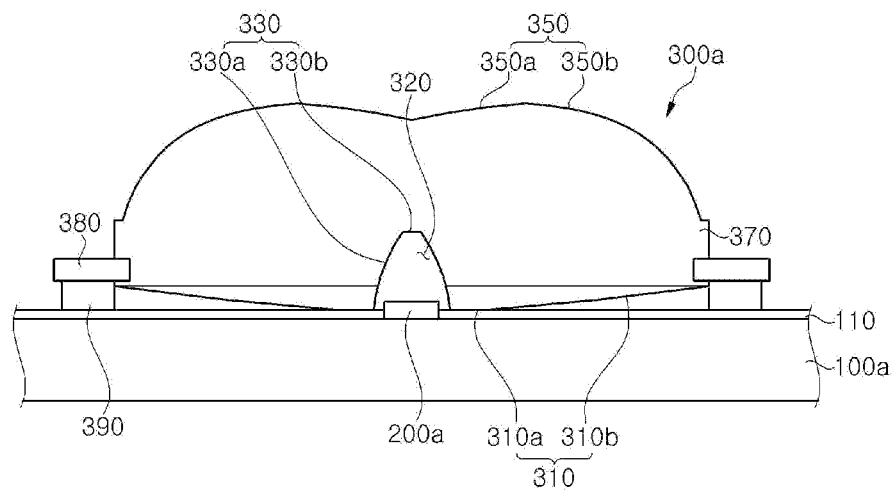
FIG. 2a is a sectional view of a light emitting module according to one embodiment of the present invention.
Figure 2B:
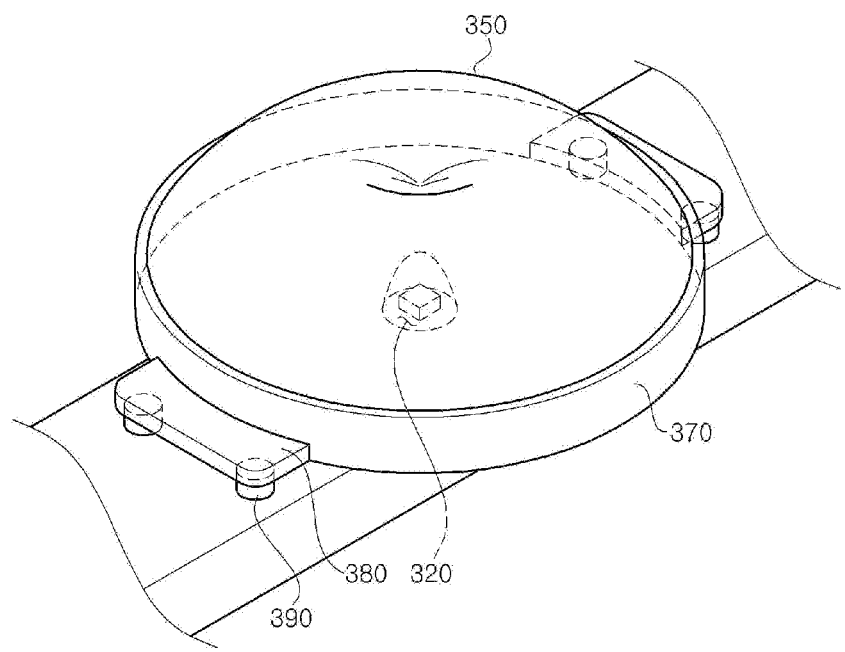
FIG. 2b is a perspective view of the light emitting module according to one embodiment of the present invention.
Figure 2C:
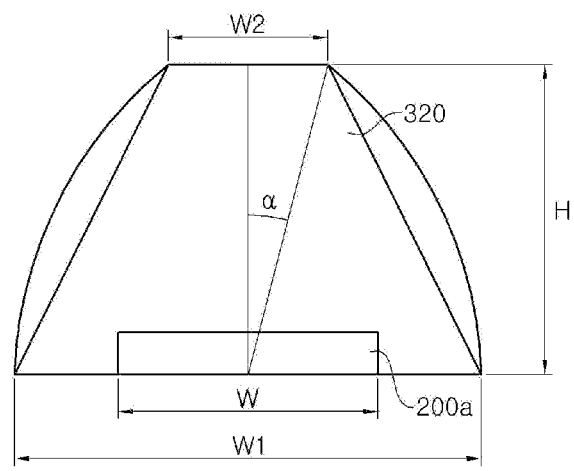
FIG. 2c is a schematic diagram of a concave section of a lens according to one embodiment of the present invention.
Figure 2D:
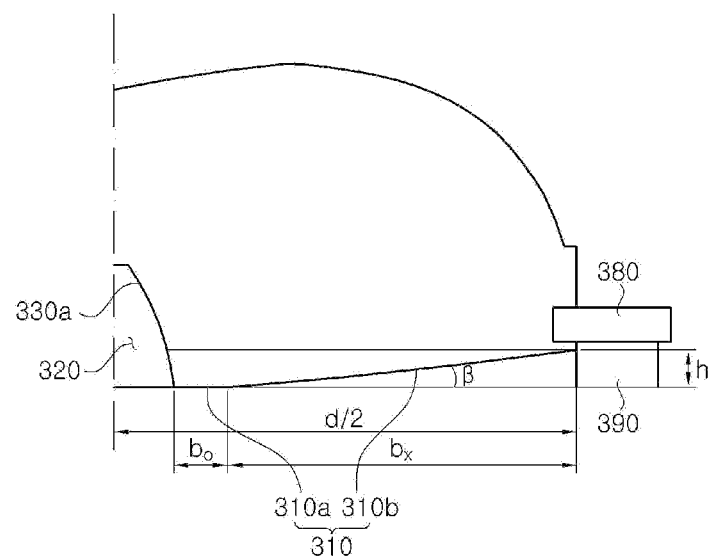
FIG. 2d is a partially enlarged sectional view of a lens used in the light emitting module according to one embodiment of the present invention.

FIG. 2a is a sectional view of a light emitting module according to one embodiment of the present invention, FIG. 2b is a perspective view of a lens 300a of the light emitting module, FIG. 2c is a schematic sectional view of a concave section 320 of the lens 300a, and FIG. 2d is a partially enlarged sectional view of a lower surface 310 of the lens 300a.

First, referring to FIG. 2a, the light emitting module includes a circuit board 100a, a light emitting device 200a, and a lens 300a. Further, the light emitting module may include a reflective sheet 110.

The circuit board 100a is a printed circuit board having a circuit pattern formed thereon. Here, although a single light emitting device 200a is illustrated as being mounted on the circuit board 100a, a plurality of light emitting devices 200a may be arranged on the circuit board 100a, and a lens 300a may be disposed above each of the light emitting devices 200a. As shown in FIG. 2b, the circuit board 100a may have an elongated bar shape, a width of which is smaller than the width of the lens 300a.

Unlike a typical light emitting diode package, the light emitting device 200a does not include a chip mounting member for mounting a light emitting diode chip, and is directly mounted on the circuit board 100a by flip-chip bonding without using a bonding wire. Namely, the circuit board 100a serves as a chip mounting member for mounting the light emitting diode chip. Since the bonding wire is not used, there is no need for a molding member for protection of the wire. The light emitting device 200a according to the embodiments of the invention will be described below in more detail with reference to FIG. 5.

The reflective sheet 110 is disposed between the lens 300a and the circuit board 100a. The reflective sheet 110 may be coated with a white reflective material having high reflectivity in order to reflect light having a wide wavelength band in a visible range. The reflective sheet 110 reflects light, which travels towards the circuit board 100a, into the lens 300a.

The lens 300a includes a lower surface 310 and an upper surface 330, and may further include a flange 370, leg supports 380 and legs 390. The lower surface 310 includes a concave section 320, a flat surface 310a surrounding the concave section 320, and a slanted surface 310b surrounding the flat surface 310a.

The concave section 320 defines a light incident surface 330 through which light emitted from the light emitting device 200a enters the lens 300a. Namely, the light incident surface 330 is an inner surface of the concave section 320. The light incident surface 330 includes a side surface 330a and an upper end surface 330b. The concave section 320 has a shape, the width of which gradually decreases in an upward direction from an entrance of the concave section. The side surface 330a may be a slanted surface having a constant slope from the entrance to the upper end surface 330b, or a decreasing slope from the entrance to the upper end surface 330b. Namely, as shown in FIG. 2c, the side surface 330a is illustrated as a straight line or an upwardly protruding curve in a vertical cross-sectional view.

The light emitting device 200a is substantially disposed within the concave section 320. To this end, an entrance width (W1) of the concave section 320 is greater than the width (w) of the light emitting device 200a. For example, the entrance width (W1) of the concave section 320 is twice or less the width (w) of the light emitting device 200a. In some embodiments of the invention, since the light emitting device 200a has a smaller size than the typical light emitting device 200, there is a need for accurate alignment of the light emitting device 200a with the lens 300a. Thus, the entrance width (W1) of the concave section 320 is set to be twice or less the width (w) of the light emitting device 200a in order to prevent misalignment between the lens 300a and the light emitting device 200a. In addition, a distance between the light emitting device 200a and the light incident surface 330a is decreased, thereby reducing loss of light to the outside. Particularly, the concave section 320 may have an entrance width of 3 mm or less, or 2 mm or less.

On the other hand, the upper end surface 330b of the light incident surface 330 has a flat shape. The upper end surface 330b has a width (W2) smaller than the entrance width (W1) and the width (w) of the light emitting device 200a. The width (W2) of the upper end surface 330b may be determined such that an angle ($\alpha$) defined between a straight line extending from the center of the entrance of the concave section 320 to an edge of the upper end surface 330b and a central axis of the lens becomes 3° or more, preferably 6° or more. Dispersion of light can be enhanced by allowing light emitted from the light emitting device 200a and having a beam angle in the range from +15° to −15° to enter the lens at least through the upper end surface 330b.

When the central axes of the light emitting device 200a and the lens 300a are not accurately aligned, significant variation in beam distribution of light exiting the lens 300a is prevented by the upper end surface 330b.

Here, the height (H) of the concave section 320 may be adjusted depending upon the beam angle of the light emitting device 200a, the shape of the upper surface 350 of the lens 300a, a desired beam distribution, and the like. In this embodiment, it should be noted that the concave section 320 may have a height (H) less than that of a typical lens due to reduction in entrance width (W) of the concave section 320. Particularly, the concave section 320 may have a height (H) less than the thickness of the flange 370.

Referring to FIG. 2a again, the upper surface 350 of the lens 300a has a shape that allows light entering the lens 300a to be dispersed in a wide beam distribution. For example, the upper surface 350 of the lens 300a may include a concave surface 350a disposed near a central axis of the lens 300a and a convex surface 350b extending from the concave surface. The concave surface 350a serves to disperse light, which travels towards the central axis of the lens 300a, to the outside, and the convex surface 350b serves to increase the quantity of light emitted outwards from the central axis of the lens 300a.

The flange 370 connects the upper surface 350 to the lower surface 310 and defines an external size of the lens. A side surface of the flange 370 and the lower surface 310 may be formed with convex-concave patterns. On the other hand, the legs 390 of the lens 300a are coupled to the circuit board 100a to secure the lens 300a. Each of the legs 390 may be bonded at a distal end thereof to the circuit board 100a by, for example, adhesives, or may be fitted into a hole formed in the circuit board 100a.

The legs 390 may be disposed outside an area of the upper surface 350 and may be disposed outside the slanted surface 310b of the lower surface 310 of the lens. When the legs 390 are disposed under the flat surface 310a or the slanted surface 310b, the legs 390 have a limited length, whereby the adhesives attached to the legs 390 can be stuck to the flat surface 310a or the slanted surface 310a, thereby causing deterioration in performance of the lens. On the contrary, when the legs 390 are disposed outside the flange 370, the legs 390 may be formed to a relatively long length, thereby preventing the adhesives from being attached to the flat surface 310a or the slanted surface 310a.

The leg supports 380 connect the flange 370 to the legs 390 and support the legs 390. Each of the leg supports 380 may be provided with at least two legs 390. Further, the leg supports 380 may be disposed at opposite sides of the lens 300a in one direction. Accordingly, the distance between the legs 390 in the leg supports 380 is less than the distance between the leg supports 380. Further, as shown in FIG. 2b, since the leg supports 380 are disposed at the opposite sides of the lens 300a, the leg supports 380 can be easily coupled to the circuit board 100a having a narrow width.

Referring to FIG. 2a and FIG. 2d, the lower surface 310 of the lens 300a includes the flat surface 310a surrounding the concave section 320, and the slanted surface 310b surrounding the flat surface 310a. The flat surface 310a is brought into close contact with the circuit board 100a or the reflective sheet 110, thereby preventing light loss through the lower surface of the lens 300a. In FIG. 2d, a radius of the lens 300a is defined as d/2, a length of the flat surface 310a from the light incident surface 330a to the slanted surface 310b is defined as b0, and a radial length of the slanted surface 310b is defined as bx.

The slanted surface 310b is slanted upwards at an inclined angle relative to the flat surface 310a. The slanted surface 310b extends to the side surface of the lens 300a, for example, to a side surface of the flange 370. Thus, the side surface of the lens 300a is disposed at a height (h) from the flat surface 310a. Preferably, the slanted surface 310b has an inclined angle of less than 10°. This will be described in more detail with reference to FIG. 14 and FIG. 15 below.

Figure 3:
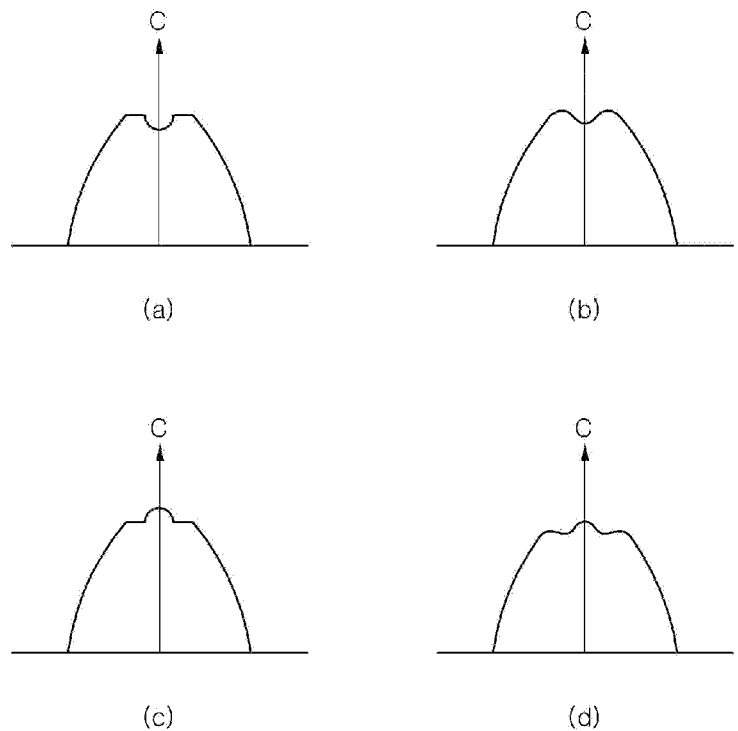
FIG. 3 shows sectional views of various modifications of the lens.

FIG. 3 shows sectional views of various modifications of the lens. Herein, various modifications of the concave section 320 shown in FIG. 1 will be described.

Figure 1B:
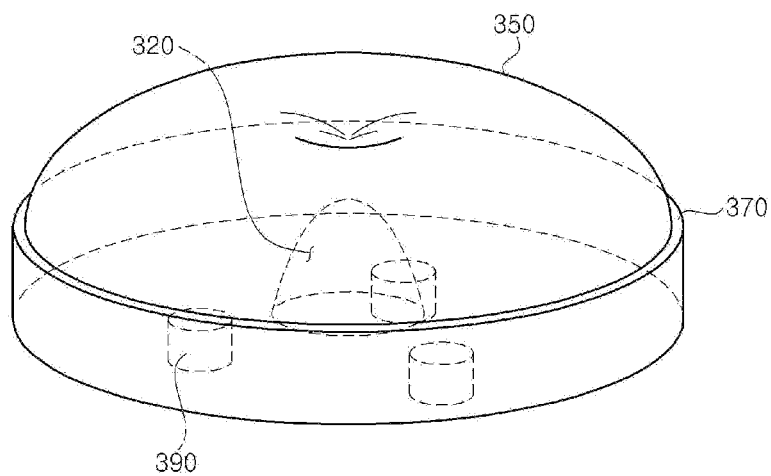
FIG. 1b is a perspective view of a lens of the light emitting module in the art.

In FIG. 3(a), the upper end surface 330b described in FIG. 1 has a downwardly protruding surface formed at a portion thereof near the central axis of the lens 300a. With this downwardly protruding surface, the lens can achieve primary control of light entering the portion of the lens near the central axis thereof.

The upper end surface of FIG. 3(b) is similar to that of FIG. 3(a) except that the upper end surface has upwardly protruding surfaces formed at portions thereof perpendicular to the central axis of the lens. Since the upper end surface is combined with the upwardly protruding surfaces and the downwardly protruding surface, the lens can relieve variation in light beam distribution due to misalignment of the light emitting device and the lens.

The upper end surface of FIG. 3(c) is different from that of FIG. 1 in that the upper end surface 330b is formed with an upwardly protruding surface at a portion thereof near the central axis of the lens. With this upwardly protruding surface, the lens can achieve further dispersion of light entering the portion of the lens near the central axis thereof.

The upper end surface of FIG. 3(d) is similar to that of FIG. 3(c) except that the upper end surface has downwardly protruding surfaces at portions thereof perpendicular to the central axis of the lens. Since the upper end surface is combined with the upwardly protruding surfaces and the downwardly protruding surface, the lens can relieve variation in light beam distribution due to misalignment of the light emitting device and the lens.

Figure 4:
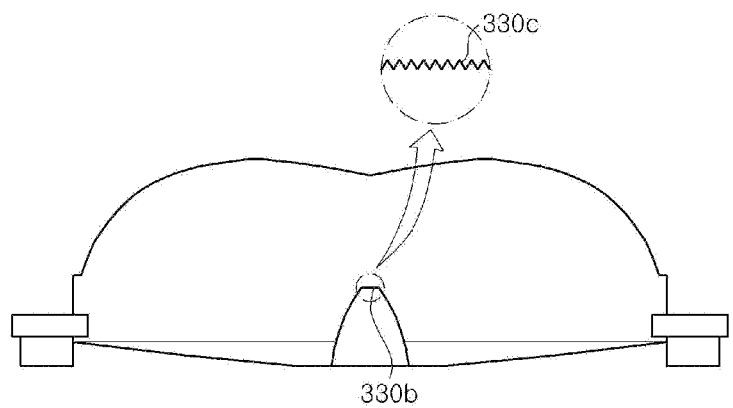
FIG. 4 is a sectional view of a further modification of the lens.

FIG. 4 is a sectional view of a further modification of the lens.

Referring to FIG. 4, the upper end surface 330b is formed with a light scattering pattern 330c. The light scattering pattern 330c may be an uneven pattern.

Generally, a relatively great luminous flux is concentrated near the central axis of the lens. Furthermore, according to embodiments of the present invention, since the upper end surface 330b is perpendicular to the central axis of the lens, more luminous flux can be concentrated near the central axis of the lens. Accordingly, with the structure of the upper end surface 330b having the light scattering pattern 330c, it is possible to disperse luminous flux near the central axis (C) of the lens.

Figure 5:
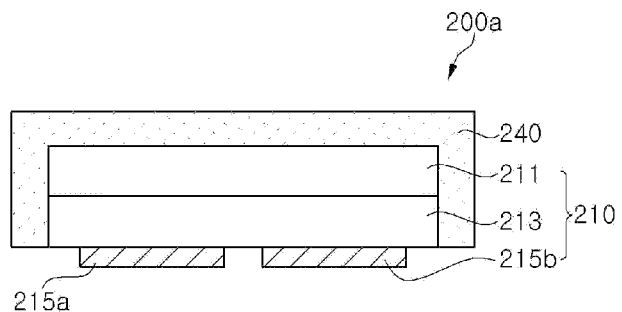
FIG. 5 is a schematic sectional view of a light emitting device according to embodiments of the present invention.

FIG. 5 is a schematic sectional view of a light emitting device 200a according to embodiments of the present invention.

Referring to FIG. 5, the light emitting device 200a includes a light emitting diode chip 210 and a wavelength conversion layer 240. The light emitting diode chip 210 includes a substrate 211 and a semiconductor stack 213, and may further include electrode pads 215a, 215b.

The light emitting diode chip 210 is a flip chip light emitting diode chip and the electrode pads 215a, 215b are disposed on a bottom surface of the light emitting diode chip. The light emitting diode chip 210 may have a width (w) in the range of about 0.7 mm to about 1.5 mm.

The substrate 211 may be a growth substrate for growing a semiconductor layer, for example, a sapphire substrate or a gallium nitride substrate. Particularly, when the substrate 211 is a sapphire substrate, the index of refraction gradually decreases in the sequence of the semiconductor stack 213, the sapphire substrate 211 and the wavelength conversion layer 240, thereby improving light extraction efficiency. In a certain embodiment, the substrate 211 may be omitted.

The semiconductor stack 213 may be formed of a gallium nitride-based compound semiconductor and may emit UV or blue light.

The light emitting diode chip 210 is directly mounted on the circuit board 100a. The light emitting diode chip 210 is directly connected to a printed circuit on the circuit board 100a by flip-chip bonding without using a bonding wire. According to the present invention, since the bonding wire is not used in bonding of the light emitting diode chip 210 to the circuit board 100a, the light emitting module does not require a molding member for protecting the wire, and partial removal of the wavelength conversion layer 240 to expose the bonding pads. Thus, with the flip-chip type light emitting diode chip 210, the light emitting module can prevent occurrence of color deviation or brightness spots while simplifying a manufacturing process, as compared with a light emitting module employing a light emitting diode chip using the bonding wire.

A flip-chip type light emitting diode chip according to one embodiment of the present invention will be described below in more detail with reference to FIG. 6 to FIG. 11.

On the other hand, the wavelength conversion layer 240 covers the light emitting diode chip 210. As shown, the wavelength conversion layer 240, for example, a phosphor layer, may be formed on the light emitting diode chip 210 by conformal coating, and may convert wavelengths of light emitted from the light emitting diode chip 210. The wavelength conversion layer 240 may be coated onto the light emitting diode chip 210, and may cover upper and side surfaces of the light emitting diode chip 210. In a certain embodiment, the wavelength conversion layer 240 may be formed to cover only the upper surface of the light emitting diode chip 210. The light emitting module according to the invention may realize various colors through combination of light emitted from the light emitting diode chip 210 and the wavelength conversion layer 240, particularly, mixed light such as white light.

In this embodiment, the wavelength conversion layer 240 may be previously formed by conformal coating on the light emitting diode chip 210 to be mounted together with the light emitting diode chip 210 on the circuit board 100a.

Next, a method of fabricating the light emitting diode chip 210 will be described to facilitate understanding of the light emitting diode chip 210.

FIG. 6 to FIG. 10 are sectional views illustrating a method of fabricating a flip-chip type light emitting diode chip according to one embodiment of the present invention, in which (a) is a plan view and (b) is a cross-sectional view taken along line A-A.

Figure 6:
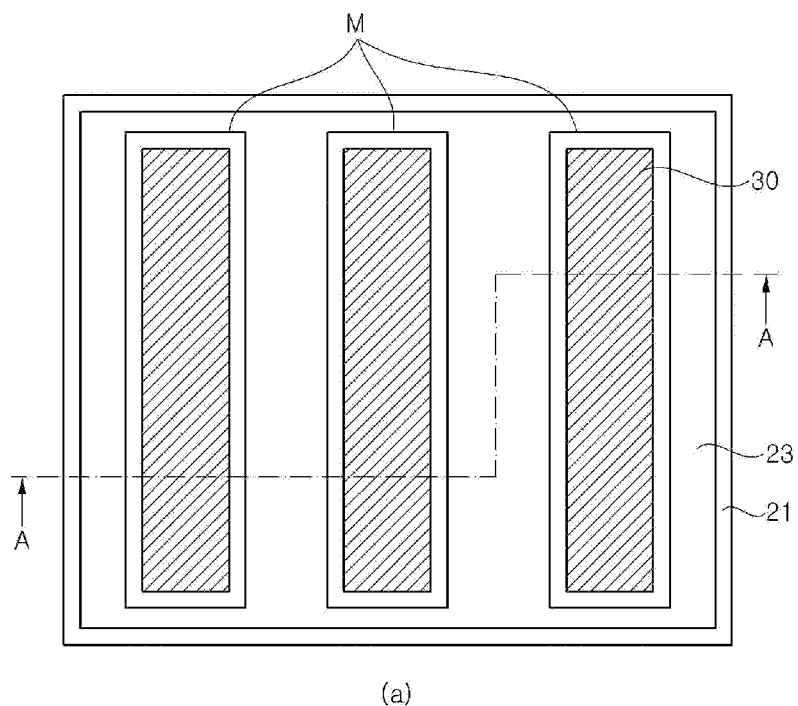
FIG. 6 to FIG. 11 are sectional views illustrating a method of fabricating a light emitting diode chip, which can be used as a light emitting device according to embodiments of the present invention, in which (a) is a plan view and (b) is a cross-sectional view taken along line A-A.
Figure 6:
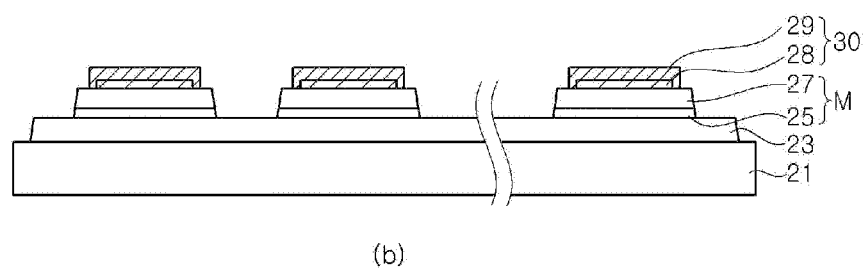

First, referring to FIG. 6, a first conductive-type semiconductor layer 23 is formed on a growth substrate 21, and a plurality of mesas M is formed on the first conductive-type semiconductor layer 23 to be separated from each other. Each of the mesas M includes an active layer 25 and a second conductive-type semiconductor layer 27. The active layer 25 is disposed between the first conductive-type semiconductor layer 23 and the second conductive-type semiconductor layer 27. In addition, a reflective electrode 30 is disposed on each of the plural mesas M.

The plural mesas M may be formed by growing epitaxial layers including the first conductive-type semiconductor layer 23, the active layer 25 and the second conductive-type semiconductor layer 27 on the growth substrate 21 through metal organic chemical vapor deposition, and patterning the second conductive-type semiconductor layer 27 and the active layer 25 to expose the first conductive-type semiconductor layer 23. Side surfaces of the plural mesas M may be slanted by a process, such as photoresist reflow. The slanted side surface profile of the mesas M improves efficiency in extraction of light generated in the active layer 25.

As shown, the plural mesas M may have elongated shapes extending parallel to each other in one direction. Such shapes of the mesas M simplify formation of the plural mesas M having the same shape on a plurality of chip areas on the growth substrate 21.

The reflective electrode 30 may be formed on each of the mesas M after formation of the plurality of mesas M, but is not limited thereto. Alternatively, after growing the second conductive-type semiconductor layers 27, the reflective electrodes 30 may be formed on the second conductive-type semiconductor layers 27 before formation of the mesas M. The reflective electrode 30 covers most of an upper surface of the mesa M and has substantially the same shape as a planar shape of the mesa M.

Each of the reflective electrodes 30 includes a reflective layer 28 and may further include a barrier layer 29. The barrier layer 29 may cover upper and side surfaces of the reflective layer 28. For example, after a pattern of reflective layers 28 is formed, the barrier layers 29 are formed thereon such that the barrier layers 29 covers the upper and side surfaces of the reflective layers 28. For example, the reflective layers 28 may be formed by depositing Ag, Ag alloy, Ni/Ag, NiZn/Ag, or TiO/Ag layers, followed by patterning. The barrier layers 29 may be formed of Ni, Cr, Ti, Pt, Rd, Ru, W, Mo, TiW or combinations thereof and prevent diffusion of metallic materials of the reflective layer or contamination thereby.

After formation of the plurality of mesas M, the first conductive-type semiconductor layer 23 may be subjected to etching along an edge thereof. As a result, an upper surface of the substrate 21 can be exposed. A side surface of the first conductive-type semiconductor layer 23 may also be slanted.

Figure 11:
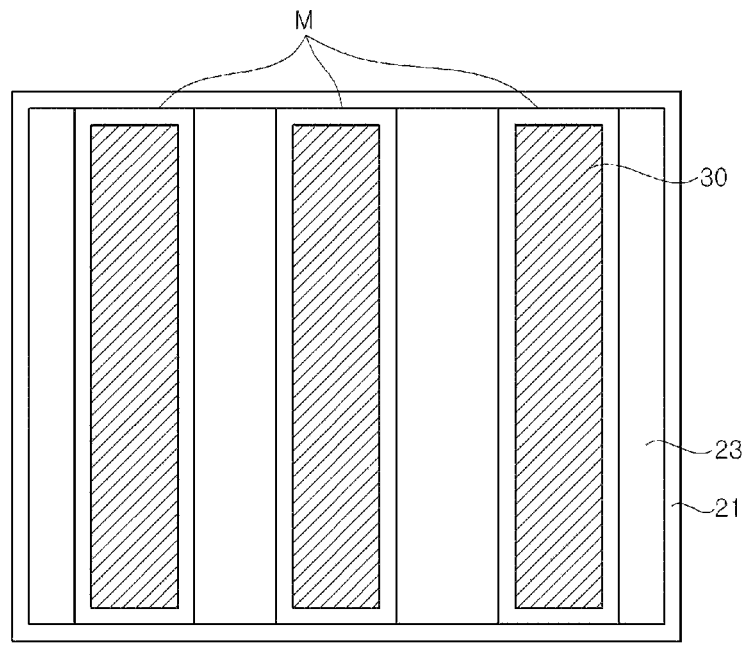

As shown in FIG. 6, the plurality of mesas M may be defined within an upper area of the first conductive-type semiconductor layer 23. That is, the plurality of mesas M may be formed in an island shape on the upper area of the first conductive-type semiconductor layer 23. Alternatively, as shown in FIG. 11, the mesas M extending in one direction may be formed to reach an upper edge of the first conductive-type semiconductor layer 23. Specifically, edges of lower surfaces of the plural mesas M are coincident with the edge of the first conductive-type semiconductor layer 23 in one direction. With this structure, the upper surface of the first conductive-type semiconductor layer 23 is partitioned by the plurality of mesas M.

Figure 7:
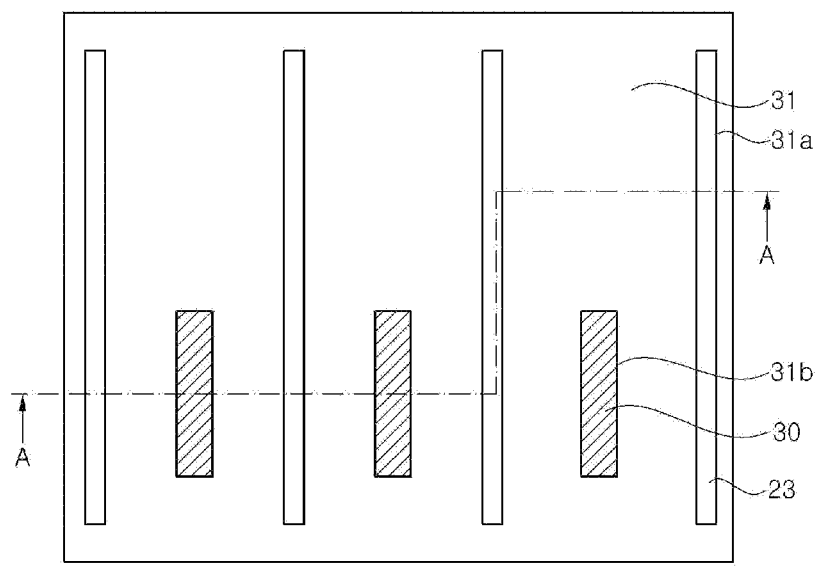
Figure 7:
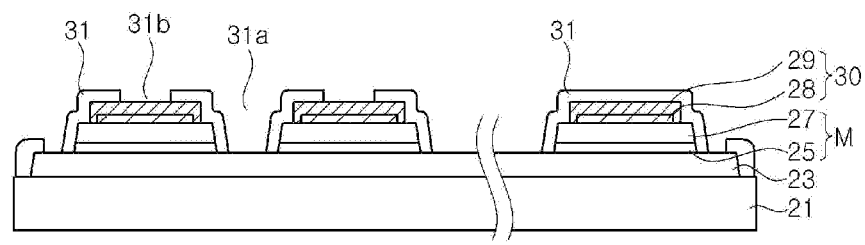

Referring to FIG. 7, a lower insulation layer 31 is formed to cover the plurality of mesas M and the first conductive-type semiconductor layer 23. The lower insulation layer 31 is formed with openings 31a, 31b in certain regions thereof to allow electrical connection to the first conductive-type semiconductor layer 23 and the second conductive-type semiconductor layers 27 therethrough. For example, the lower insulation layer 31 may include openings 31a which expose the first conductive-type semiconductor layer 23, and openings 31b which expose the reflective electrodes 30.

The openings 31a may be disposed on a region between the mesas M and near an edge of the substrate 21, and may have an elongated shape extending along the mesas M. The openings 31b are restrictively disposed on upper sides of the mesas M, and are biased towards the same ends of the mesas.

The lower insulation layer 31 may be formed of an oxide layer such as $SiO_2$ and the like, a nitride layer such as $SiN_x$ and the like, or an insulation layer such as SiON, $MgF_2$ and the like, by chemical vapor deposition (CVD) and the like. The lower insulation layer 31 may consist of a single layer or multiple layers. In addition, the lower insulation layer 31 may be a distributed Bragg reflector (DBR) in which low refractive material layers and high refractive material layers are alternately stacked one above another. For example, an insulating reflective layer having high reflectance may be formed by stacking dielectric layers such as $SiO_2/TiO_2$, $SiO_2/Nb_2O_5$, and the like.

Figure 8:
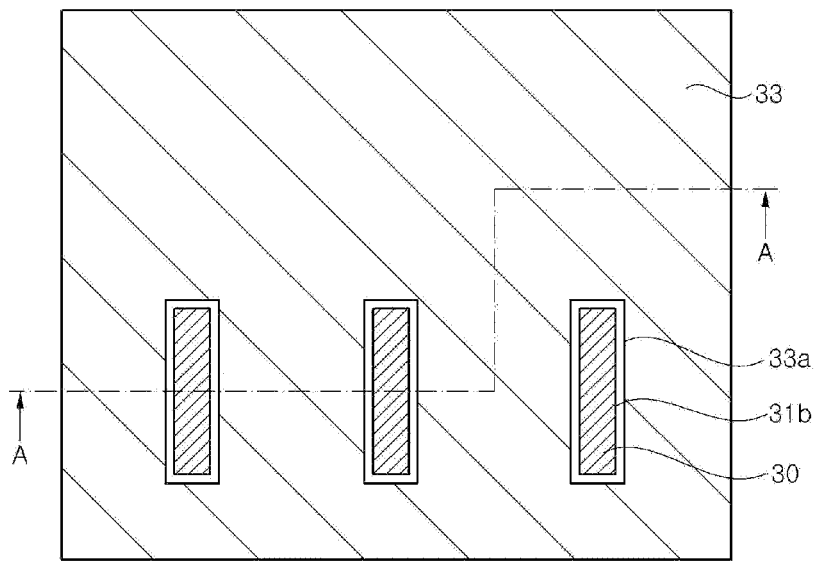
Figure 8:
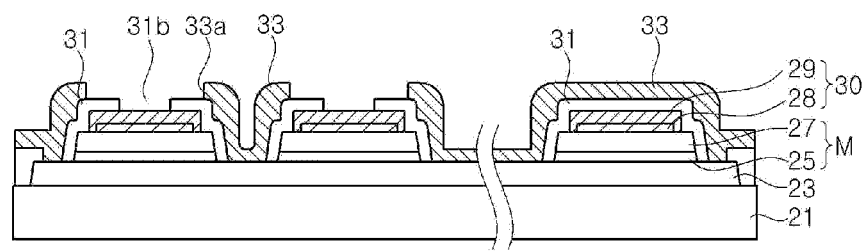

Referring to FIG. 8, the current spreading layer 33 is formed on the lower insulation layer 31. The current spreading layer 33 covers the plurality of mesas M and the first conductive-type semiconductor layer 23. In addition, the current spreading layer 33 has openings 33a, which are disposed within upper areas of the mesas M and expose the reflective electrodes, respectively. The current spreading layer 33 may form ohmic contact with the first conductive-type semiconductor layer 23 through the openings 31a of the lower insulation layer 31. The current spreading layer 33 is insulated from the plural mesas M and the reflective electrodes 30 by the lower insulation layer 31.

Each of the openings 33a of the current spreading layer 33 has a larger area than the openings 31b of the lower insulation layer 31 to prevent the current spreading layer 33 from contacting the reflective electrodes 30. Thus, sidewalls of the openings 33a are disposed on the lower insulation layer 31.

The current spreading layer 33 is formed over a substantially overall area on the substrate 31 excluding the openings 33a. Accordingly, current can be easily dispersed through the current spreading layer 33. The current spreading layer 33 may include a highly reflective metal layer, such as an Al layer, and the highly reflective metal layer may be formed on an adhesive layer, such as Ti, Cr, Ni or the like. Further, a protective layer having a monolayer or composite layer structure of Ni, Cr or Au may be formed on the highly reflective metal layer. The current spreading layer 33 may have a multiple layer structure of, for example, Ti/Al/Ti/Ni/Au.

Figure 9:
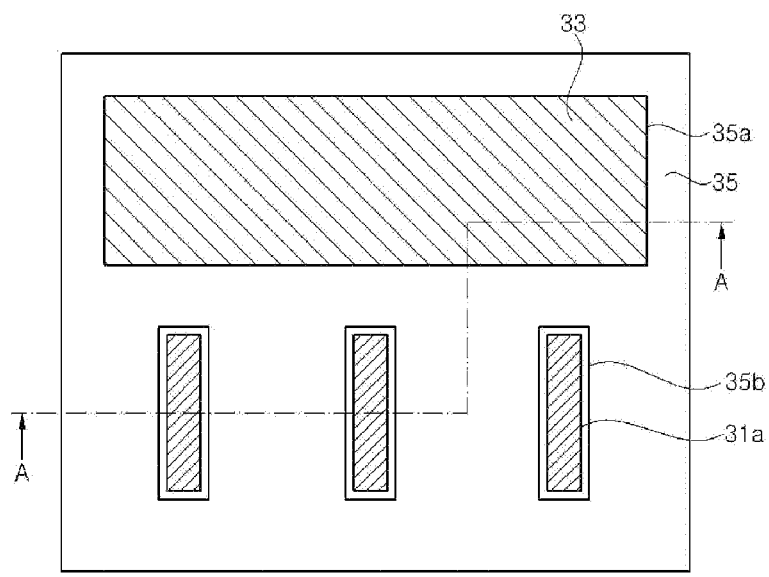
Figure 9:
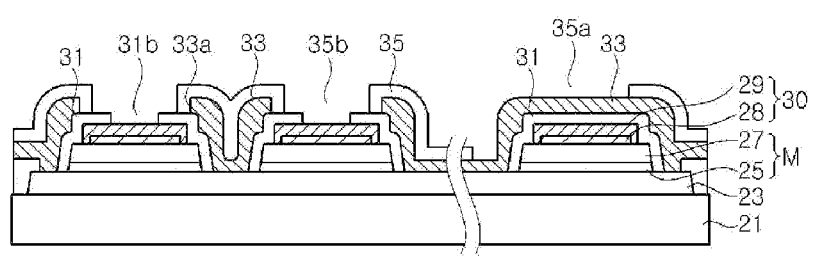

Referring to FIG. 9, an upper insulation layer 35 is formed on the current spreading layer 33. The upper insulation layer 35 includes openings 35a through which the current spreading layer 33 is exposed, and openings 35b through which the reflective electrodes 30 are exposed. Each of the openings 35a may have an elongated shape in a perpendicular direction relative to a longitudinal direction of the mesas M, and a larger area than the openings 35b. The openings 35b expose the reflective electrodes 30, which are exposed through the openings 33a of the current spreading layer 33 and the openings 31b of the lower insulation layer 31. The openings 35b have an area, which is narrower than that of the openings 33a of the current spreading layer 33 and is wider than that of the openings 31b of the lower insulation layer 31. Accordingly, the sidewalls of the openings 33a of the current spreading layer 33 may be covered with the upper insulation layer 35.

The upper insulation layer 35 may be formed using an oxide insulation layer, a nitride insulation layer, a combination thereof or alternating layers thereof, or a polymer such as polyimide, Teflon, Parylene, and the like.

Figure 10:
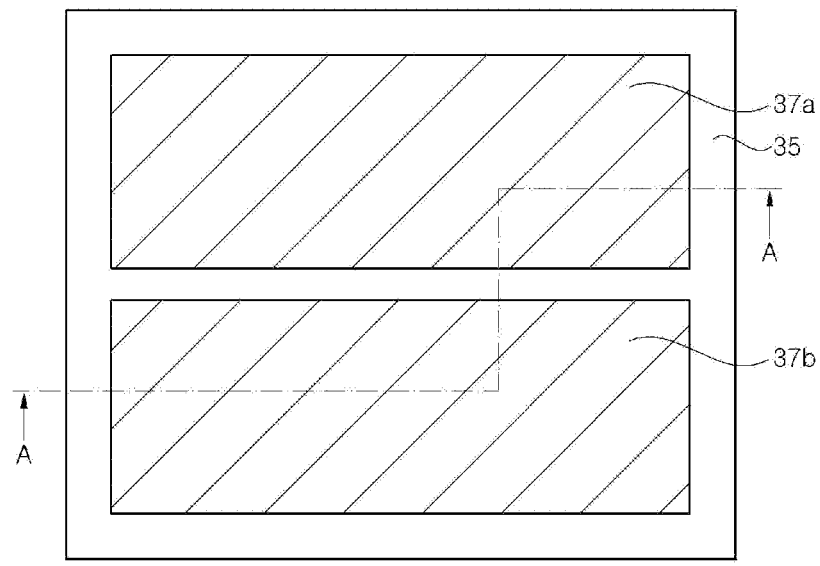
Figure 10:
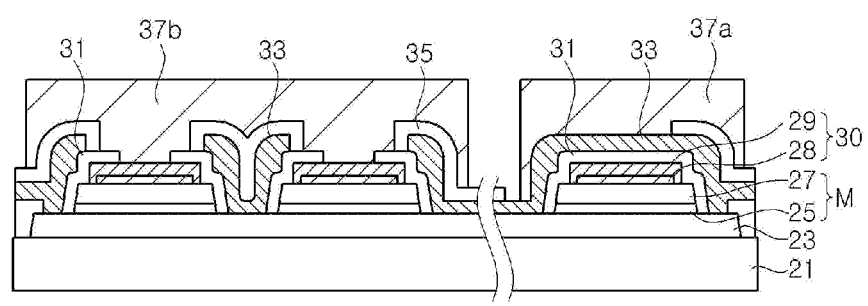

Referring to FIG. 10, a first pad 37a and a second pad 37b are formed on the upper insulation layer 35. The first pad 37a is connected to the current spreading layer 33 through the openings 35a of the upper insulation layer 35, and the second pad 37b is connected to the reflective electrodes 30 through the openings 35b of the upper insulation layer 35. The first pad 37a and the second pad 37b may be used as pads for SMT or connection of bumps for mounting the light emitting diodes on the circuit board and the like.

The first and second pads 37a, 37b may be formed simultaneously by the same process, for example, a photolithography and etching process or a lift-off process. The first and second pads 37a, 37b may include a bonding layer formed of for example, Ti, Cr, Ni, and the like, and a highly conductive metal layer formed of Al, Cu, Ag, Au, and the like. The first and second pads 37a, 37b may be formed to have distal ends disposed on the same plane, whereby light emitting diode chips 220 can be flip-chip bonded to conductive patterns formed on circuit board 100a to 100d and flush with each other.

Then, the growth substrate 21 is divided into individual light emitting diode chip units, thereby providing finished light emitting diode chips. The growth substrate 21 may be removed from the light emitting diode chips before or after division into individual light emitting diode chip units.

Next, the light emitting diode chip according to the embodiment of the present invention will be described with reference to FIG. 10.

The light emitting diode chip includes the first conductive-type semiconductor layer 23, the mesas M, the reflective electrodes 30, and the current spreading layer 33, and may include the growth substrate 21, the lower insulation layer 31, the upper insulation layer 35, the first pad 37a and the second pad 37b.

The substrate 21 may be a growth substrate, for example, a sapphire substrate or a gallium nitride substrate, for growth of gallium nitride-based epitaxial layers. For example, the substrate 21 is a sapphire substrate and may have a thickness of 200 μm or more, preferably 250 μm or more.

The first conductive-type semiconductor layer 23 is a continuous layer and has a plurality of mesas M separated from each other thereon. As described with reference to FIG. 6, each of the mesas M includes the active layer 25 and the second conductive-type semiconductor layer 27, and has an elongated shape extending in one direction. Here, the mesas M have a stack structure of gallium nitride-based compound semiconductors. As shown in FIG. 6, the mesas M may be restrictively formed within an upper area of the first conductive-type semiconductor layer 23. Alternatively, as shown in FIG. 11, the mesas M may extend to an edge of the upper surface of the first conductive-type semiconductor layer 23 in one direction, whereby the upper surface of the first conductive-type semiconductor layer 23 can be divided into a plurality of regions. As a result, the light emitting module has further improved current spreading capabilities by relieving current crowding near corners of the mesas M.

The reflective electrodes 30 are respectively disposed on the plurality of mesas M, thereby forming ohmic contact with the second conductive-type semiconductor layers 27. As described with reference to FIG. 6, each of the reflective electrodes 300 may include the reflective layer 28 and the barrier layer 29, which may cover the upper and side surfaces of the reflective layer 28.

The current spreading layer 33 covers the plurality of mesas M and the first conductive-type semiconductor layer 23. The current spreading layer 33 is disposed within the upper area of each of the mesas M and has the openings 33a through which the reflective electrodes 30 are exposed. In addition, the current spreading layer 33 forms ohmic contact with the first conductive-type semiconductor layer 23 and is insulated from the plurality of mesas M. The current spreading layer 33 may include a reflective metal such as Al.

The current spreading layer 33 may be insulated from the plurality of mesas M by the lower insulation layer 31. For example, the lower insulation layer 31 is disposed between the plurality of mesas M and the current spreading layer 33 to insulate the current spreading layer 33 from the plurality of mesas M. Further, the lower insulation layer 31 is disposed within the upper area of each of the mesas M, and may have the openings 31b through which the reflective electrodes 30 are exposed and the openings 31a through which the first conductive-type semiconductor layer 23 is exposed. The current spreading layer 33 may be connected to the first conductive-type semiconductor layer 23 through the openings 31a. The openings 31b of the lower insulation layer 31 have a narrower area than the openings 33a of the current spreading layer 33 and are completely exposed through the openings 33a.

The upper insulation layer 35 covers at least part of the current spreading layer 33. In addition, the upper insulation layer 35 has the openings 35b through which the reflective electrodes 30 are exposed. In addition, the upper insulation layer 35 may has the openings 35a through which the current spreading layer 33 is exposed. The upper insulation layer 35 may cover the sidewalls of the openings 33a of the current spreading layer 33.

The first pad 37a may be disposed on the current spreading layer 33 and may be connected to the current spreading layer 33 through, for example, the openings 35a of the upper insulation layer 35. In addition, the second pad 37b is connected to the reflective electrodes 30 exposed through the openings 35b. The first pad 37a and the second pad 37b may have upper ends flush with each other, as shown in FIG. 10.

According to the present invention, the current spreading layer 33 covers the mesas M and substantially an overall area of the first conductive-type semiconductor layer 23 between the mesas M. With this structure, current can be easily dispersed through the current spreading layer 33.

Furthermore, the current spreading layer 23 may include a reflective metal layer such as an Al layer or the lower insulation layer may be formed of an insulation reflective layer, such that light, which is not reflected by the reflective electrodes 30, can be reflected by the current spreading layer 23 or the lower insulation layer 31, thereby improving light extraction efficiency.

The flip-chip type light emitting diode chip according to the present embodiment has a relatively wide beam distribution.

Figure 12:
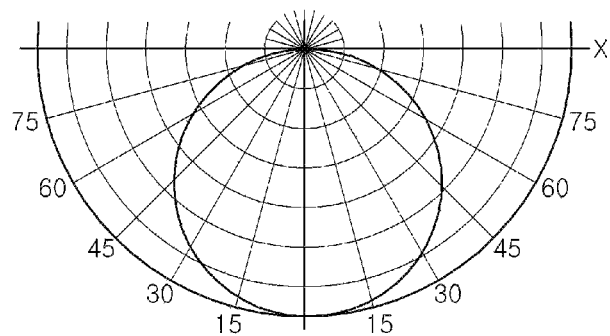
FIGS. 12 (a) and (b) are graphs depicting beam distributions of a light emitting diode chip including a typical light emitting diode package 200 and a flip-chip type light emitting diode chip including a conformal coating layer according to the present invention, respectively.
Figure 12:
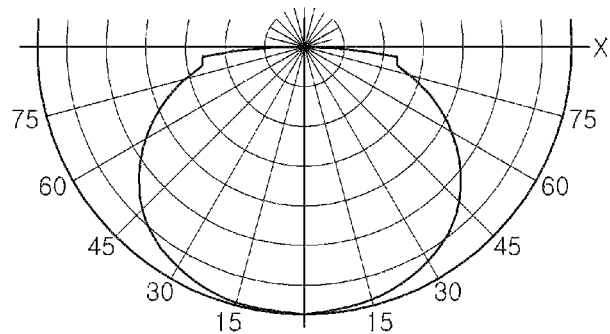

FIG. 12 shows graphs depicting beam distributions of a typical light emitting diode package 200 and a light emitting device according to one embodiment of the present invention, that is, a flip-chip type light emitting diode chip 210 including a conformal coating layer 240.

Referring to FIG. 12(a), the typical light emitting diode package 200 has a beam angle of about 120°. On the other hand, as shown in FIG. 12(b), the light emitting device according to the present invention has a beam angle of about 145°. That is, it can be seen that the beam angle of the chip-level light emitting device according to the present invention is about 25 degrees greater than the beam angle of the typical package-level light emitting device.

Figure 13:
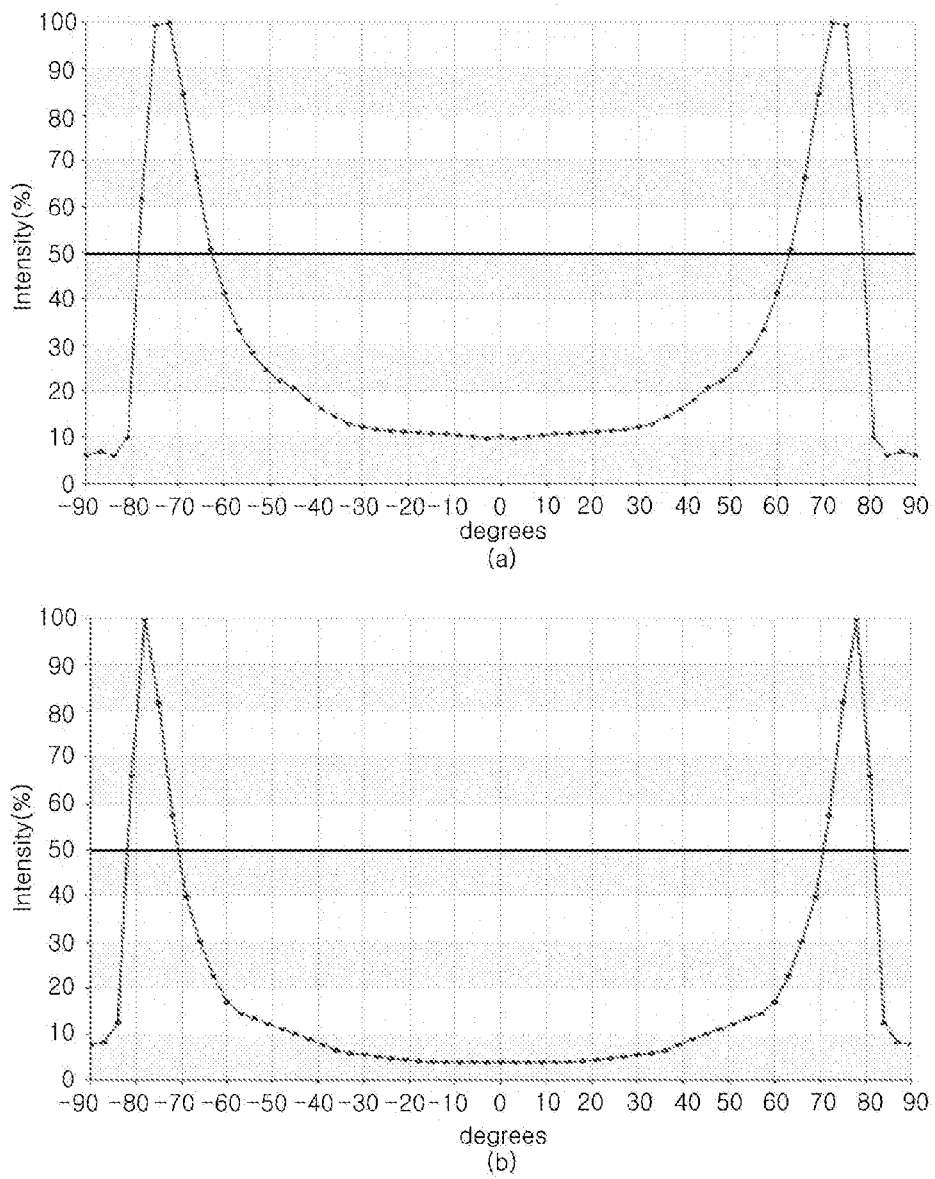
FIGS. 13 (a) and (b) are graphs depicting beam distributions of a light emitting module including a typical light emitting diode package 200 and a light emitting module employing a flip-chip type light emitting diode chip including a conformal coating layer according to the present invention, respectively.

FIG. 13(a) shows a graph depicting a beam distribution of a light emitting module employing the typical light emitting diode package 200 having a beam angle of about 120°, and FIG. 13(b) shows a graph depicting a beam distribution of a light emitting module employing the flip-chip type light emitting diode chip 210 including the conformal coating layer 240 having a beam angle of about 145°. Here, light beam distributions were simulated in one axis direction using light emitting devices and lenses having the same illumination distribution in an angular direction. The light beam distribution indicates luminous intensity according to beam angle at a place separated a predetermined distance from each of the light emitting devices. Here, the lower surface of the lens has a generally flat surface without the legs 380 and the slanted surface 310b.

In these graphs, a higher angle between maximum luminous intensities and a lower ratio (C/P) of luminous intensity at a center to the maximum luminous intensity indicate broader and more uniform distribution of light. In FIG. 13(a), an angle between the maximum luminous intensities was 146°, and the ratio (C/P) of luminous intensity at the center to the maximum luminous intensity was 10%. In FIG. 13(b), the angle was 152° and the ratio was 4.5%. In addition, relative to a point corresponding to a luminous intensity ratio of 50%, the angle was 65° in FIG. 13(a) and the angle was 70° in FIG. 13(b). Accordingly, the light emitting module employing the flip-chip type light emitting diode chip 210 including the conformal coating layer 240 according to the present invention can disperse light over a wider and more uniform area than the typical light emitting module.

Figure 14:
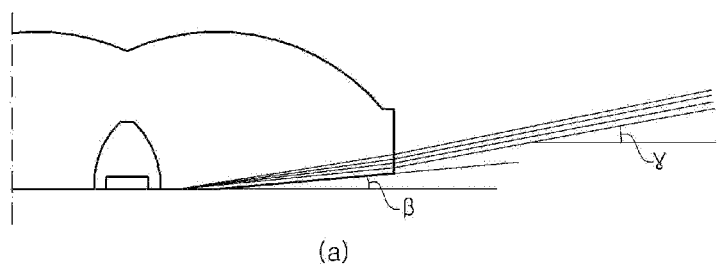
FIGS. 14 (a), (b) and (c) are schematic views of light exit directions according to various slopes of a slanted surface of a lower surface of the lens.
Figure 14:
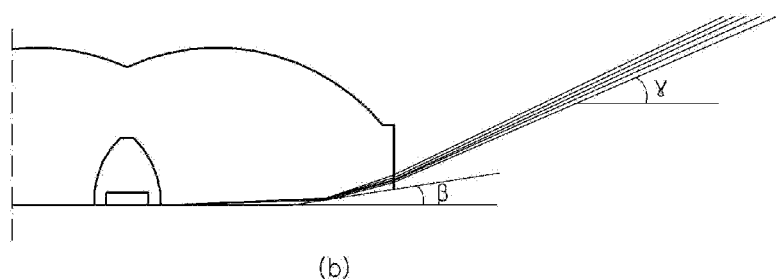
Figure 14:
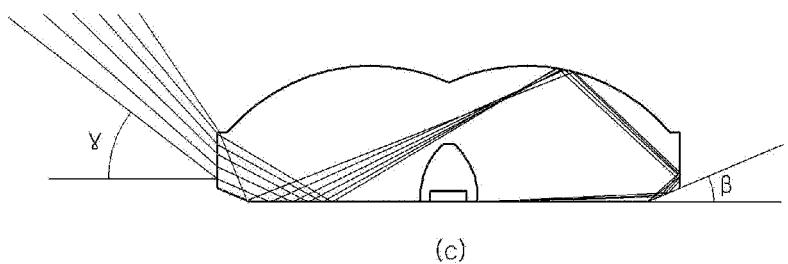
Figure 15:
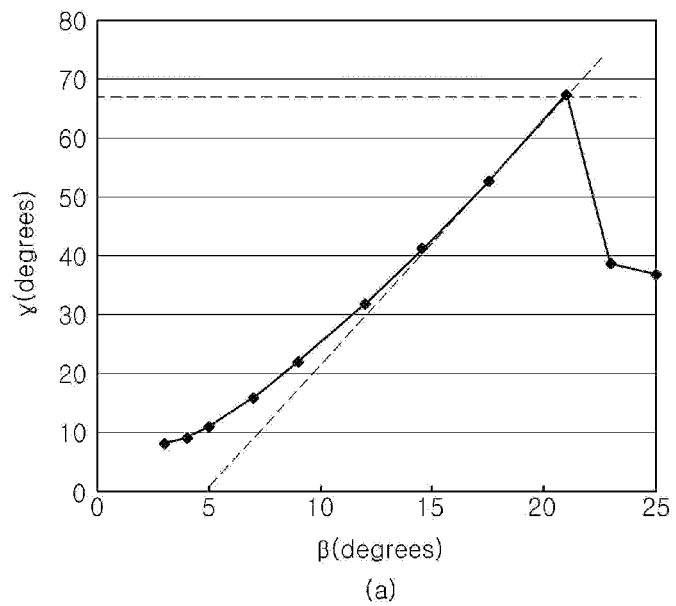
FIGS. 15 (a) and (b) are graphs depicting light exit angles according to the various slopes of the slanted surface of the lower surface of the lens.
Figure 15:
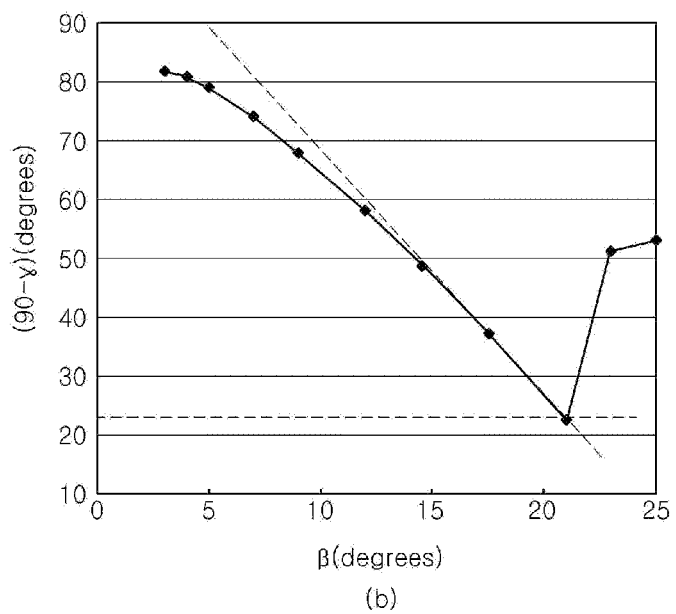

FIGS. 14 (a), (b) and (c) are schematic views of light exit directions according to various slopes of the slanted surface 310b of the lower surface of the lens.

Simulation was performed with regard to light beams emitted at an angle ranging from 0° to 3° from below the side surface of the light emitting device 200a to the flat surface 310a of the lower surface of the lens, and an angle (γ) of light beams exiting the lens 300a relative to the flat surface 310a of the lower surface of the lens was calculated.

In FIG. 14(a), the inclined angle (β) was about 4° and an angle (γ) of light beams exiting the lens 300a was 9°. Thus, an exit angle (90-γ) of light relative to the central axis of the lens was 81°.

In FIG. 14(b), the inclined angle (β) was about 9.5° and an angle (γ) of light beams exiting the lens 300a was 24°. Thus, the exit angle (90-γ) of light relative to the central axis of the lens was 66°.

In FIG. 14(c), the inclined angle (β) was about 23°, and the light beams exiting the lens 300a exited through the opposite side of the lens 300a via total reflection inside the lens 300a. In this case, the angle (γ) was 39°. Thus, the exit angle (90-γ) of light relative to the central axis of the lens was 51°.

Through such simulation at various angles, the angles (γ) of light beams according to various inclined angles (β) of the slanted surface of the lower surface of the lens were calculated and depicted in the graph of FIG. 15(a). FIG. 15(b) shows a graph obtained by converting the inclined angles (β) shown in the graph of FIG. 15(a) into the light exit angle (90-γ).

Referring to FIG. 15(a) or (b), it can be seen that, as the inclined angle (β) was increased, the angle (γ) was gradually increased, and when the inclined angle (β) exceeded about 20°, total reflection of light occurred inside the lens, as in FIG. 14(c). On the other hand, at an inclined angle (β) of less than 5°, the angle (γ) was gradually increased with increasing inclined angle (β), and at an inclined angle (β) of 5° or more, the angle (γ) was relatively rapidly increased. Then, at an inclined angle (β) of 15° or more, the angle (γ) of light beams exiting the lens 300a became substantially a right angle relative to the flat surface of the lower surface of the lens.

According to the above simulation result, when the inclined angle (β) exceeds 20°, since light loss occurs due to total reflection inside the lens 300a and the light exit angle (90-γ) is less than 70°, light is collected towards the central axis of the lens, thereby making it difficult to realize uniform distribution of light.

When the inclined angle (β) is between about 10° and about 20°, light beams exit through the side surface of the lens without total reflection. However, since the light exit angle (90-γ) is less than 70°, light is collected towards the central axis of the lens, thereby making it difficult to realize uniform distribution of light.

On the contrary, when the inclined angle (β) is less than 10°, the light exit angle (90-γ) exceeds about 70°, thereby enabling wide dispersion of light.

Although various embodiments have been described above, it should be understood that the present invention is not limited to these embodiments. In addition, features of a certain embodiment may also be applied to other embodiments in the same or similar way without departing from the spirit and scope of the invention.

What is claimed is:

1. A light-emitting module, comprising:
   a circuit board;
   a light-emitting device disposed on the circuit board; and
   a lens configured to disperse light emitted from the light-emitting device, the lens comprising:
   a lower surface comprising a concave section through which light enters the lens;
   an upper surface through which light exits the lens;
   legs coupled to the circuit board and disposed outside of the upper surface;
   a flange; and
   leg supports connecting the legs and the flange,
   wherein:
   the light-emitting device is disposed within the concave section of the lens;
   the leg supports are disposed on an upper surface of the circuit board; and
   each of the leg supports is connected to two of the legs.

2. The light-emitting module according to claim 1, wherein the light-emitting device comprises:
   a light-emitting diode chip; and
   a wavelength conversion layer disposed on the light-emitting diode chip,
   wherein the light-emitting diode chip is flip-chip bonded to the circuit board.

3. The light-emitting module according to claim 2, wherein the wavelength conversion layer is disposed on upper and side surfaces of the light-emitting diode chip.

4. The light-emitting module according to claim 1, wherein:
   the concave section of the lens comprises an upper end surface and a side surface extending from the upper end surface to an entrance of the concave section, and
   the width of the concave section gradually decreases from the entrance to the upper end surface.

5. The light-emitting module according to claim 4, wherein the side surface of the concave section is slanted and has a constant slope from the entrance of the concave section to the upper end surface thereof, or is slanted and has a slope that decreases from the entrance to the upper end surface.

6. The light-emitting module according to claim 1, wherein:
   the lower surface of the lens comprises a flat first surface surrounding the concave section and a slanted second surface surrounding the first surface; and
   the first surface is disposed closer to the circuit board than the second surface.

7. The light-emitting module according to claim 6, further comprising a reflective sheet disposed on the circuit board,
   wherein the reflective sheet is disposed between the first surface and the circuit board.

8. The light-emitting module according to claim 6, wherein the second surface is slanted upwards from the first surface away from the circuit board, and has a slope of less than about 10° relative to the first surface.

9. A lens configured to disperse light emitted from a light-emitting device, comprising:
   a lower surface comprising a concave section through which light enters the lens;
   an upper surface through which light exits the lens;
   legs disposed outside of the upper surface;
   a flange; and
   leg supports connecting the legs and the flange,
   wherein:
   the lower surface of the lens comprises a flat first surface surrounding the concave section and a slanted second surface surrounding the first surface;
   the legs are disposed farther from the concave section than the second surface; and
   the leg supports are disposed at opposite sides of the lens from each other, each leg support being connected to two of the legs.

10. The lens according to claim 9, wherein the second surface is slanted upwards from the first surface and has a slope of less than about 10° relative to the first surface.

11. The lens according to claim 9, wherein a first distance between the two legs connected to each leg support is less than a second distance between the leg supports.

12. A light-emitting module, comprising:
   a circuit board;
   a flip-chip type light-emitting diode package disposed on the circuit board; and
   a lens configured to disperse light emitted from the light-emitting diode package, the lens comprising:
: a lower surface comprising a concave section through which light enters the lens;
: an upper surface through which light exits the lens;
: legs coupled to the circuit board and disposed outside of the upper surface;
: a flange; and
: leg supports connecting the legs and the flange, wherein:
: the light-emitting diode package has a beam angle of about 145°, and is disposed within the concave section of the lens;
: the leg supports are disposed on an upper surface of the circuit board; and
: each of the leg supports is connected to two of the legs.

13. The light-emitting module according to claim 12, wherein the flip-chip type light-emitting diode package comprises:
: a light-emitting diode chip, comprising:
:: electrode pads disposed on the circuit board;
:: a semiconductor stack disposed on the electrode pads; and
:: a growth substrate disposed on the semiconductor stack; and
: a wavelength conversion layer covering the light-emitting diode chip.

14. The light-emitting module according to claim 12, wherein:
: an angle between maximum luminous intensity of light emitted from the light-emitting diode package is 152°; and
: a ratio of luminous intensity at the center of the beam to the maximum luminous intensity is 4.5%.

15. The light-emitting module according to claim 14, wherein the ratio of luminous intensity is 50% at a beam angle of 70°.

* * * * *